(12) United States Patent
Park (10) Patent No.: US 9,159,740 B2
(45) Date of Patent: Oct. 13, 2015

(54) VERTICAL TYPE SEMICONDUCTOR DEVICE AND FABRICATION METHOD THEREOF

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/278,070

(22) Filed: May 15, 2014

(65) Prior Publication Data

US 2014/0248750 A1 Sep. 4, 2014

Related U.S. Application Data

(62) Division of application No. 13/846,293, filed on Mar. 18, 2013, now abandoned.

(30) Foreign Application Priority Data

Dec. 14, 2012 (KR) .......................... 10-2012-0146381

(51) Int. Cl.
| | |
|---|---|
| *H01L 27/115* | (2006.01) |
| *H01L 29/18* | (2006.01) |
| *H01L 29/66* | (2006.01) |
| *H01L 29/423* | (2006.01) |
| *H01L 29/78* | (2006.01) |
| *H01L 27/24* | (2006.01) |
| *H01L 45/00* | (2006.01) |

(52) U.S. Cl.
CPC ...... *H01L 27/11556* (2013.01); *H01L 27/2454* (2013.01); *H01L 27/2463* (2013.01); *H01L 29/18* (2013.01); *H01L 29/4236* (2013.01); *H01L 29/66666* (2013.01); *H01L 29/66825* (2013.01); *H01L 29/7827* (2013.01); *H01L 45/06* (2013.01); *H01L 45/1233* (2013.01)

(58) Field of Classification Search
CPC .................. H01L 27/11556; H01L 29/66666; H01L 29/66825
See application file for complete search history.

(56) References Cited

U.S. PATENT DOCUMENTS

| | | | | |
|---|---|---|---|---|
| 6,599,798 | B2* | 7/2003 | Tews et al. ..................... | 438/249 |
| 7,781,285 | B2* | 8/2010 | Kim et al. ..................... | 438/242 |
| 2012/0248529 | A1* | 10/2012 | Liu et al. ...................... | 257/334 |

* cited by examiner

*Primary Examiner* — Marvin Payen
*Assistant Examiner* — Victor Barzykin
(74) *Attorney, Agent, or Firm* — IP & T Group LLP

(57) ABSTRACT

A vertical memory device and a method of fabricating the same are provided. The vertical type semiconductor device includes a common source region formed in a cell area of a semiconductor substrate. A channel region is formed on the common source region. The channel region has a predetermined height and a first diameter. A drain region is formed on the channel region. The drain region has a predetermined height and a second diameter larger than the first diameter. A first gate electrode surrounding the channel region.

11 Claims, 12 Drawing Sheets

VERTICAL TYPE SEMICONDUCTOR DEVICE AND FABRICATION METHOD THEREOF

CROSS-REFERENCES TO RELATED APPLICATION

This application is a division of U.S. patent application Ser. No. 13/846,293 filed on Mar. 18, 2013, which claims priority under 35 U.S.C. 119(a) to Korean application number 10-2012-0146381, filed on Dec. 14, 2012. The disclosure of each of the foregoing application is incorporated herein by reference in its entirety.

BACKGROUND

1. Technical Field

Various embodiments generally relates to a vertical type semiconductor device, and more particularly, to a vertical type semiconductor device and a method of fabricating the same.

2. Related Art

The distribution rate of portable digital devices has been increasing day by day and ultra-high integration, ultra-high speed, and ultra-low power of memory devices, which are embedded in a limited size to process large capacity of data with high speed, have been required.

Studies on vertical memory devices have been actively progressed to meet these demands. Recently, the vertical structures are introduced into resistance memory devices which are spotlighted as next-generation memory devices.

The resistance memory devices are devices which select a memory cell through an access device, change a resistance state of a data storage material electrically connected to the access device, and store data. There are typically phase-change random access memories (PCRAMs), resistance RAMs (ReRAMs), magnetoresistive RAMs (MRAMs), and the like as the resistance memory devices.

Diodes or transistors may be employed as the access device of the resistive memory devices. In particular, the threshold voltage of the transistors is controlled to be low as compared with the diodes and thus the operation voltage thereof can be reduced, and the transistors have received attention again as the access device of the resistance memory devices by applying the vertical structure thereto.

That is, since the voltage of 1.1 V or more has to be applied to the diodes, there is a limitation to reduce an operation voltage of the diodes. Further, when the diodes are formed on a word line, a resistance of the word line is varied according to locations in the cells to cause word line to be bounced.

Since transistors in the related art are formed in a horizontal structure, the reduction rate is restricted. However, the vertical transistors can sufficiently ensure current drivability in the limited channel area. Further, voltage drop due to an external resistance component may be improved through reduction in a source resistance.

However, when a current vertical structure transistor is formed, a vertical structure transistor is formed by etching a semiconductor substrate in a cell area and a horizontal structure transistor is formed in the semiconductor substrate in a peripheral area. Therefore, desired degree of integration may not be obtained in a subsequent process due to a step between the cell area and the peripheral area. Further, there is a need for an alternative to compensate current drivability of the transistor lower than the diode.

SUMMARY

An exemplary vertical type semiconductor device may include a common source region formed in a cell area of a semiconductor substrate; a channel region formed on the common source region, the channel region having a predetermined height and a first diameter; a drain region formed on the channel region, the drain region having a predetermined height and a second diameter larger than the first diameter; and a first gate electrode surrounding the channel region.

A method of fabricating an exemplary vertical type semiconductor device may include providing a semiconductor substrate having a cell area and a peripheral area; patterning the semiconductor substrate of the cell area to form a pillar structure; forming, in the pillar structure, a recess from a bottom of the pillar structure to a predetermined height; and forming a first gate electrode to surround the recess.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary implementations will be described in greater detail with reference to the accompanying drawings. In drawings, (a) is a cross-sectional view of a vertical type semiconductor device in a first direction (an X-direction, a A1-A2 direction of (c) in each drawing), for example, a word line direction, (b) is a cross-sectional view of the vertical type semiconductor device in a s direction (a Y-direction, a B1-B2 direction of (c) in each drawing), for example, a bit line direction, (c) is a plan view of the vertical type semiconductor device, and (p) is a cross-sectional view of a peripheral area of a vertical type semiconductor device.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 18 are views illustrating a method of fabricating an exemplary vertical semiconductor device.

Figure 1:
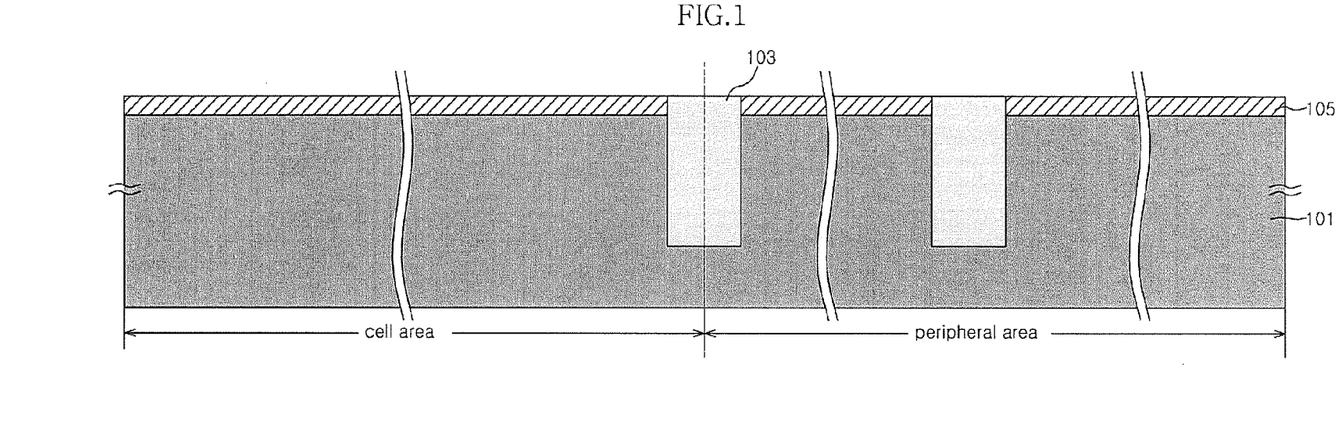
FIGS. 1 to 18 are views illustrating a method of fabricating an exemplary vertical type semiconductor device.

Referring to FIG. 1, a hard mask 105 is formed on a semiconductor substrate 101. A cell area and a peripheral area are defined by a device isolation layer 103 and active regions in the peripheral area are defined by the device isolation layer 103. At this time, an ion implantation process is selectively performed only the cell area to sequentially form a drain region, a channel region, and a common source region in the semiconductor substrate 101 fiducially a surface of the semiconductor substrate 101. The ion implantation process may be performed in a subsequent process.

The semiconductor substrate 101 may include a semiconductor material, such as silicon (Si), silicon germanium (SiGe) or gallium arsenic (GaAs) and may have a single-layered structure or a multiple-layered structure.

Figure 2:
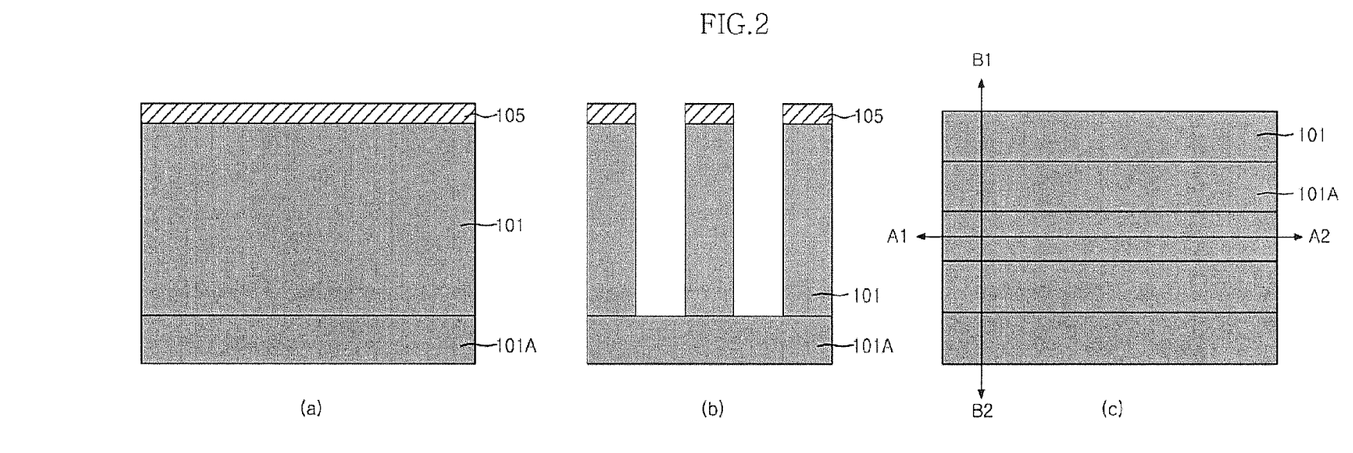

As illustrated in FIG. 2, the semiconductor substrate 101 of the cell area is patterned in a second direction (a Y-direction) to form a first pattern structure. The reference numeral 101A in FIG. 2 denotes a common source region and 105 denotes a hard mask. Although the common source region 101A has been described as being previously formed, alternatively, the common source region 101A may be formed in a subsequent process.

Figure 3:
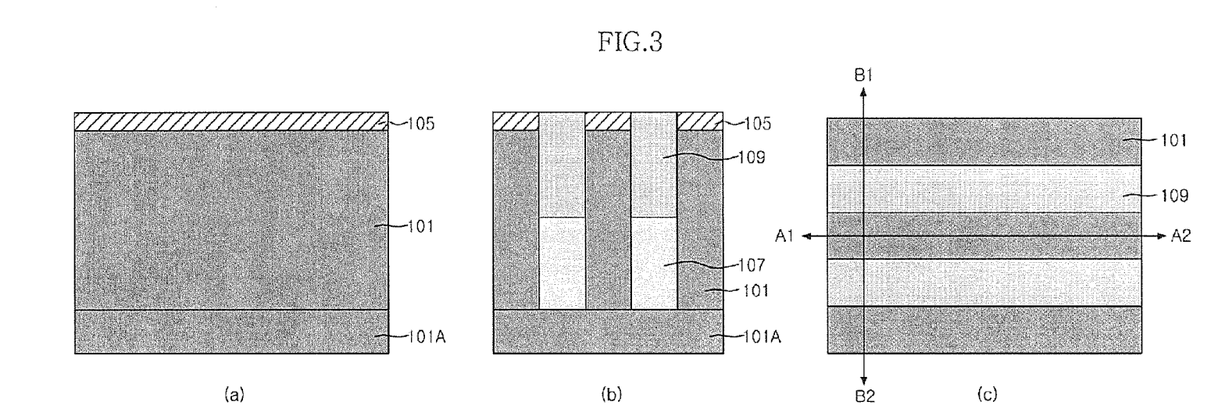

As illustrated in FIG. 3, a first insulating layer 107 and a second insulating layer 109 are sequentially formed between first pattern structures in the cell area and then planarized to expose a surface of the hard mask 105. Here, the first insulating layer 107 and the second insulating layer 109 may include a combination of materials having different etch selectivities with respect to each other. For example, the first insulating layer 107 may be formed of an oxide and the second insulating layer 109 may be formed of a nitride, which has a higher etch selectivity than the oxide.

The first insulating layer 107 formation region may be replaced with a gate electrode region in a subsequent process. Thus, a height of the first insulating layer 107 may be based on a desired channel height.

Figure 4:
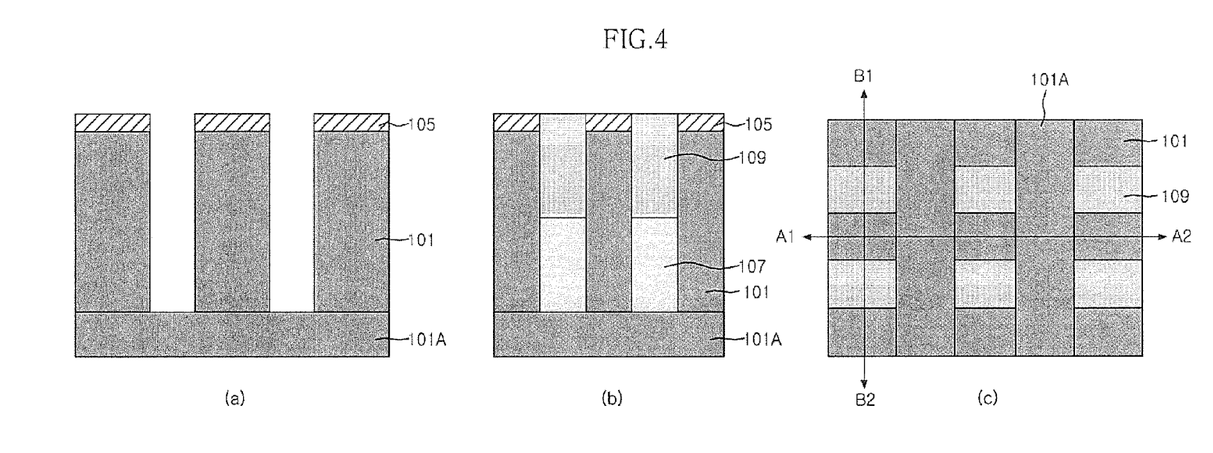

After the first and second insulating layers 107 and 109 are formed between the first pattern structures, a patterning process is performed on the semiconductor substrate in a first direction (an X-direction) to form a second pattern structure as illustrated in FIG. 4. Accordingly, surface of the semiconductor substrate 101 of space between the second pattern structures are exposed.

Figure 5:
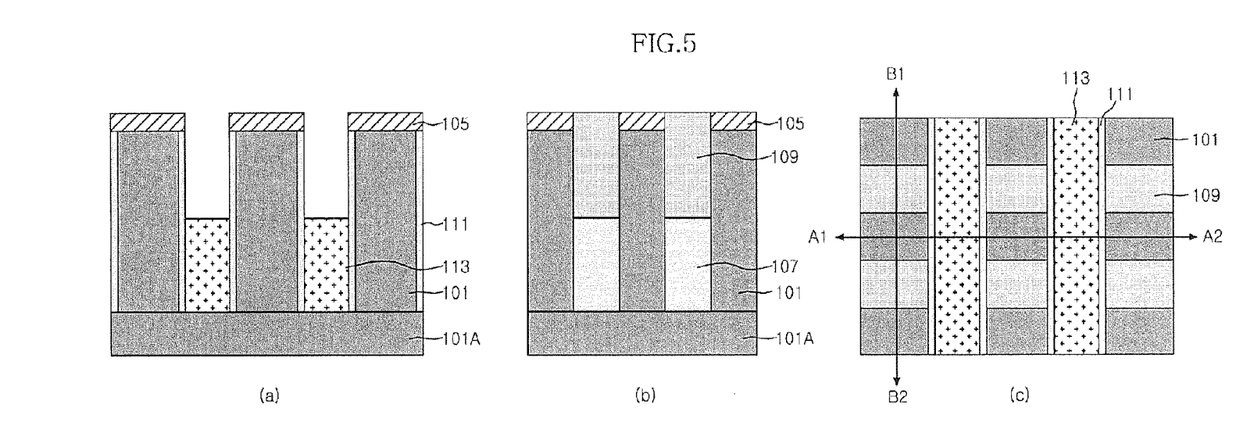

After the second pattern structure is formed, as illustrated in FIG. 5, an oxidation process is performed on the exposed surface of the semiconductor substrate 101 to form a first gate insulating layer 111. A third insulating layer 113 is formed between second pattern structures from the semiconductor substrate 101 to a predetermined height. The third insulating layer 113 may be replaced with a gate electrode in a subsequent process. Thus, a height of the third insulating layer 113 may be equal to a height of the first insulating layer 107. Further, the third insulating layer 113 may be formed of a material having the same etch characteristic as that of the first insulating layer 107. For example, the third insulating layer 113 may be formed of an oxide.

Figure 6:
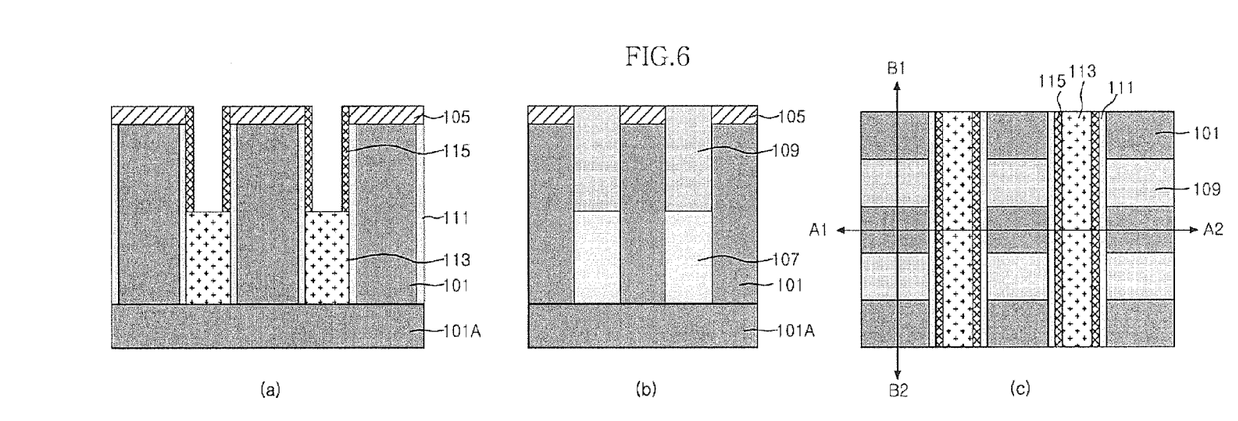

As illustrated in FIG. 6, a protection material is formed on the semiconductor substrate, including the third insulating layer 113, and is then etched back to form a protection layer 115 on a sidewall of the second pattern structure. The protection layer 115 may formed, for example, using a nitride and may protect the sidewall of the second pattern structure to prevent the semiconductor substrate 101 from being recessed in a subsequent process.

FIG. 6 illustrates a state after forming the protection layer 115. A surface of the semiconductor substrate is covered with the hard mask 105, the sidewall of the second pattern structure is covered with the protection layer 115, and a surface of the third insulating layer 113 is exposed. Therefore, the third insulating layer 113 and the first insulating layer 107 may be removed through the exposed surface of the third insulating layer 113.

Figure 7:
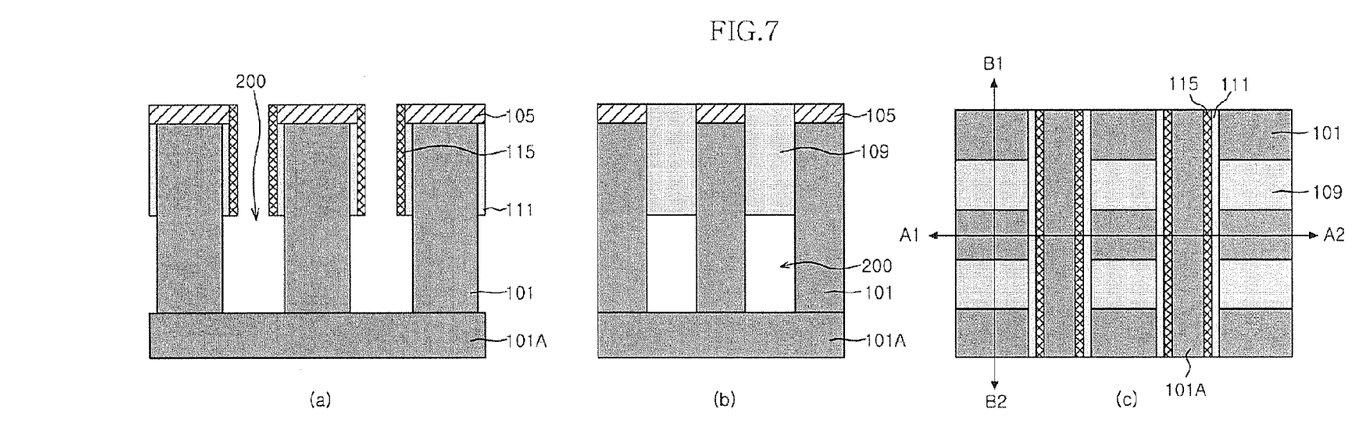

FIG. 7 illustrates a state in which the first and third insulating layers 107 and 113 are removed. A pillar structure is formed by the removal of the first and third insulating layers 107 and 113.

Figure 8:
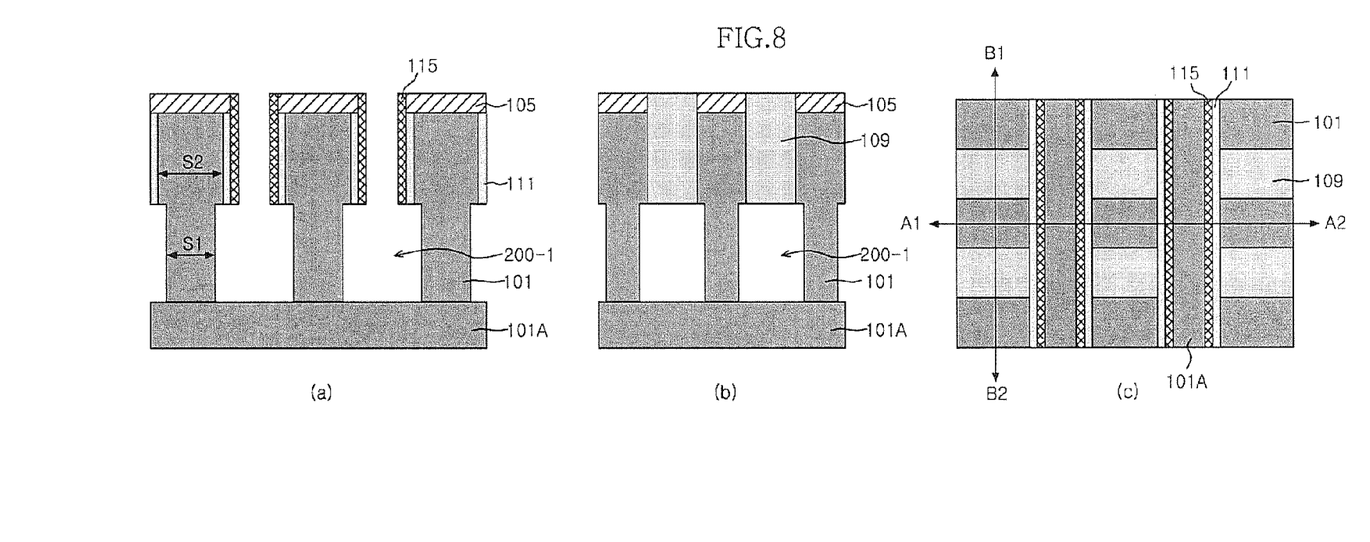

As illustrated in FIG. 8, a surface, exposed by the removal of the first and third insulating layers 107 and 113, of the semiconductor substrate 101 is recessed to a predetermined depth. The semiconductor substrate 101 may be recessed using an isotropic wet etching process. The recessed portion of the semiconductor substrate becomes a gate electrode formation region 200-1.

By recessing the semiconductor substrate 101, a diameter S1 of a portion of the semiconductor substrate 101 around the gate electrode formation region 200-1 is made smaller than a diameter 52 of an upper portion of the semiconductor substrate 101. The portion of the semiconductor substrate 101 having the diameter S1 may be formed, in a subsequent process, into a channel region. The upper portion of the semiconductor substrate 101 having the diameter S2 may be formed, in a subsequent process, into a drain region. Since the diameter S2 of the drain region is larger than the diameter S1 of the channel region as illustrated in FIG. 8, an external resistance component may be reduced and the gate electrode may be more easily controlled.

Figure 9:
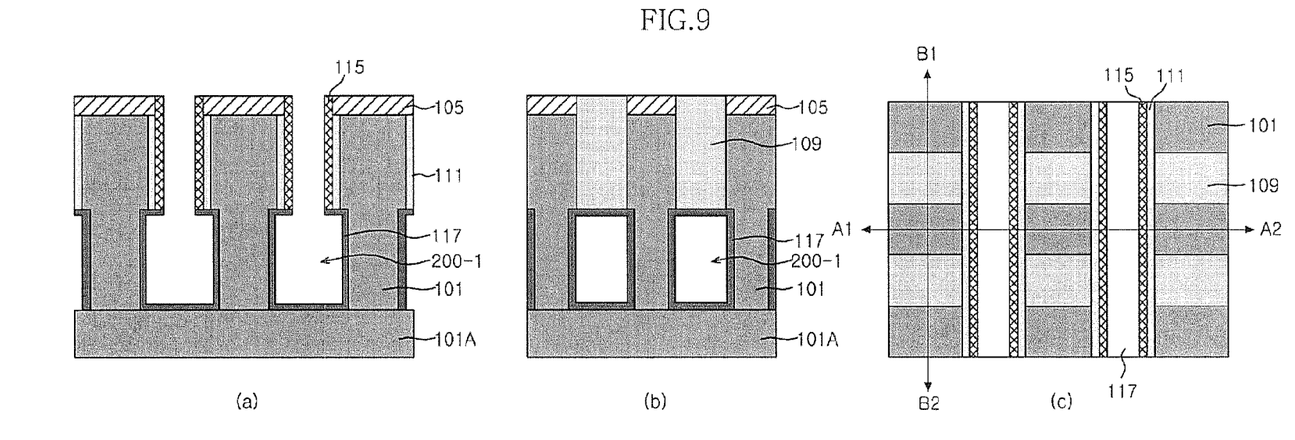

As illustrated in FIG. 9, a second gate insulating layer 117 is formed on the exposed portion of the semiconductor substrate 101 in the gate electrode formation region 200-1. The second gage insulating layer 117 may include a single layer or multiple layers using oxide of Si, tantalum (Ta), titanium (Ta), barium titanium (BaTi), barium zirconium (BaZr), zirconium (Zr), hafnium (Hf), lanthanum (La), aluminum (Al), yttrium (Y), or zirconium silicon (ZrSi). Alternatively, the second gage insulating layer 117 may include a single layer or multiple layers using a nitride of Si, Ta, Ti, BaTi, BaZr, Zr, Hf, La, Al, Y, or ZrSi.

Figure 10:
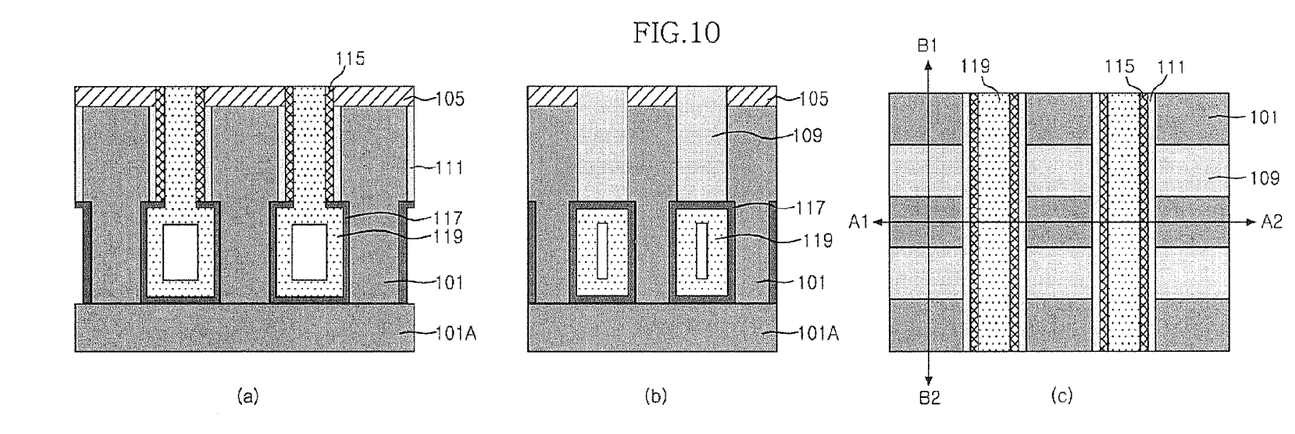

As illustrated in FIG. 10, an electrode material 119 is formed to inside of the gate electrode formation region 200-1. The electrode material 119 may be a metal, a metal alloy, a metal oxynitride, or a conductive carbon compound. For example, the electrode material 119 may be tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON). Alternatively, the electrode material 119 may include a semiconductor material, such as doped-Si and doped-SiGe, or the like.

Figure 11:
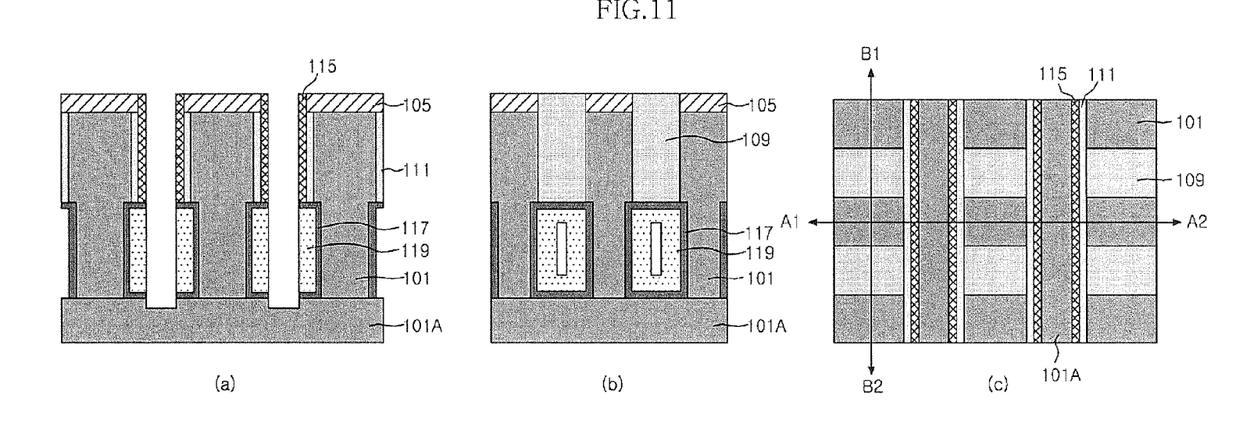

As illustrated in FIG. 11, the buried electrode material 119 is selectively removed through an exposed surface of the electrode material 119 between the second pattern structures, so that the remaining electrode material 119 surrounds a sidewall of the semiconductor substrate 101 around the gate electrode formation region 200-1. As a result, a portion of the semiconductor substrate 101 surrounded by the electrode material 119 serves as a channel region CH. As described in FIG. 8, the semiconductor substrate 101 is recessed to reduce a diameter of the channel region. Thus, a drain region D over the channel region may be formed to have a larger diameter than the channel region (CH). Thus, an external resistance component for the drain region may be reduced.

Figure 12:
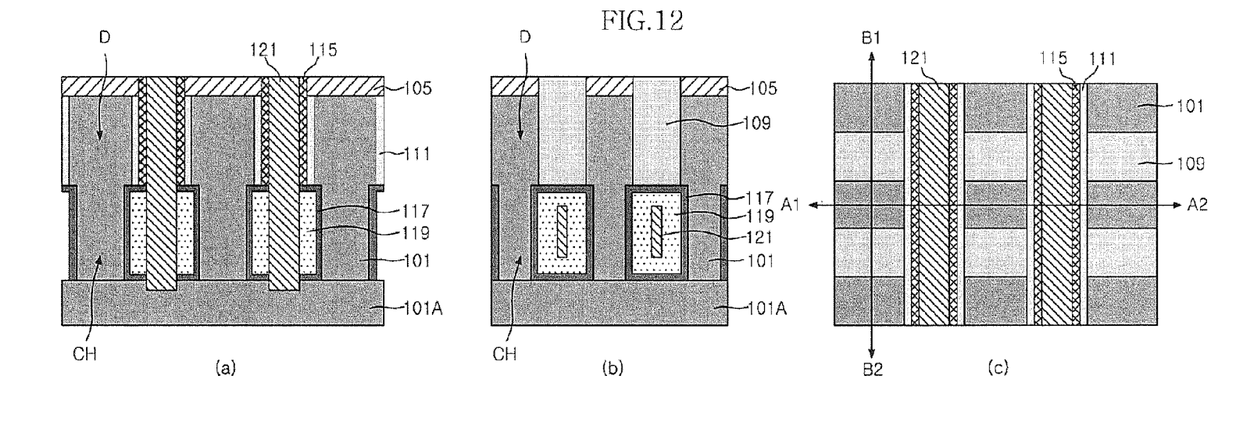

FIG. 12 illustrates a state in which a fourth insulating layer 121 is buried between pillar structures to separate cells. It can be seen from FIG. 12 that the electrode material 119 surrounds the channel region CH.

Figure 13:
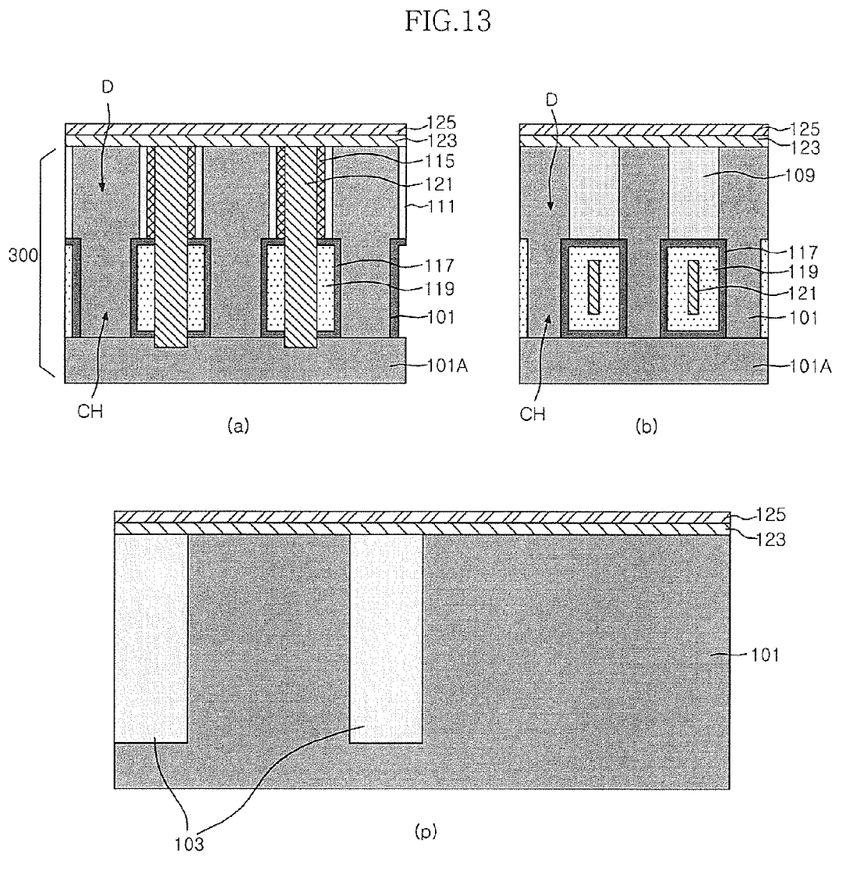

Subsequently, a process for forming a transistor in the peripheral area is performed. First, as illustrated in FIG. 13, the hard mask 105 is removed and a third gate oxide layer 123 and a first conductive layer 125 are sequentially formed on the semiconductor substrate including the cell area and a peripheral area (FIG. 13c). The reference numeral 300 denotes a bottom structure of the cell area formed by the processes illustrated in FIGS. 1 to 12.

Alternatively, if the ion implantation process for forming the drain region, the channel region, and the common source region is not performed after the device isolation process in FIG. 1, the ion implantation process may be performed on the semiconductor substrate 101 of the cell area to form the common source region, the channel region, and the drain region after the hard mask 105 of the cell area is removed.

Even if the common source region, the channel region, and the drain region are formed in any process among the above-described processes, the transistor may be an NMOS type, a PMOS type, or an impact-ionization MOS (I-MOS) type, based on a conductivity type of an impurity implanted to each region. In particular, the transistor may be an NMOS type.

If the NMOS transistor is formed, then N-type ions may be implanted into the common source region 101A and the drain region D, and P-type ions may be implanted into the channel region CH. If the PMOS transistor is formed, then P-type ions may be implanted into the common source region 101A and the drain region D, and N-type ions may be implanted into the channel region CH.

On the other hand, if an I-MOS transistor is formed, $Ni^+$-type ions may be implanted into the common source region 101A, $P^+$-type ions may be implanted into the drain region D, and $P^-$ type ions, $N^-$-type ions, or a combination thereof may be implanted into the channel region CH. Alternatively, $P^+$-type ions may be implanted into the common source region 101A, $N^+$-type ions may be implanted into the drain region D, and $P^-$-type ions, $N^-$-type ions, or a combination thereof may be implanted into the channel region CH.

Figure 14:
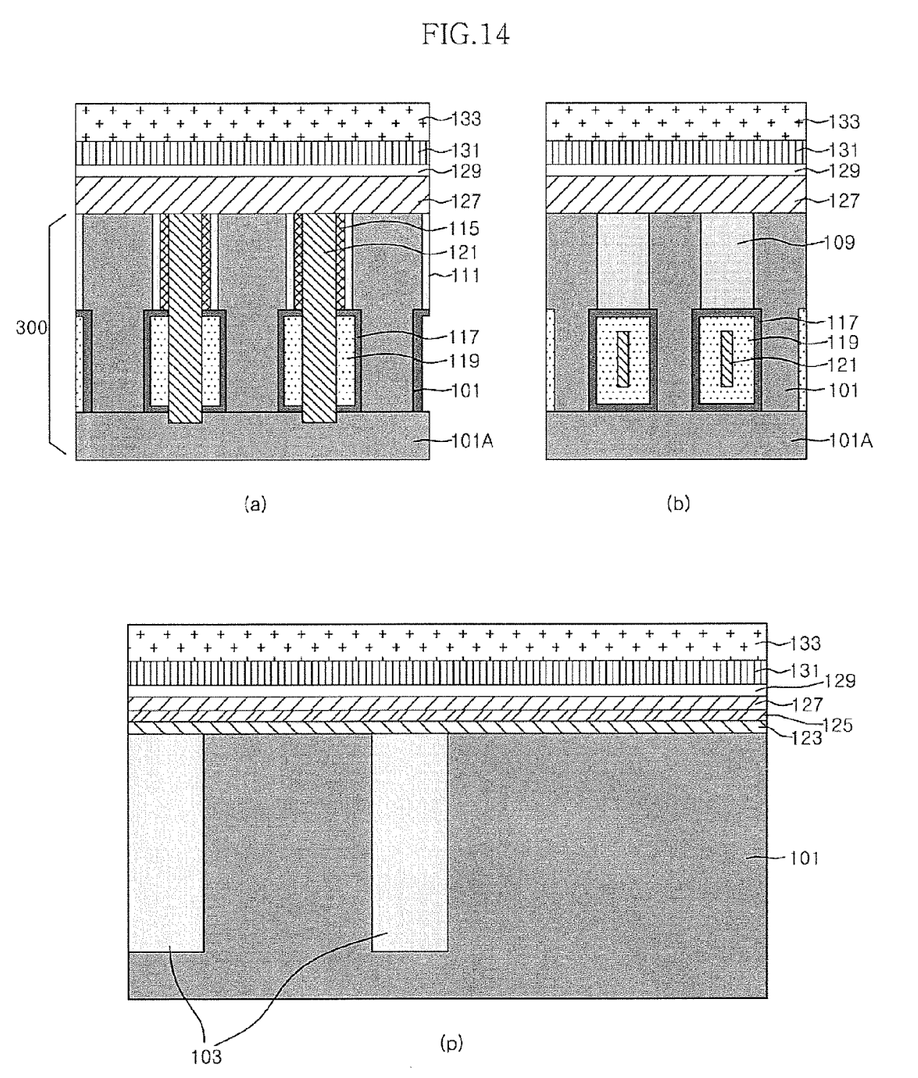

Since a memory cell, which is connected to a vertical transistor having the surround structure and formed in the bottom structure 300 of the cell area and serves as a data storage unit, is to be formed, as illustrated in FIG. 14, the first conductive material 125 and the third gate oxide layer 123 in the cell area are removed. A second conductive layer 127, a barrier metal layer 129, a third conductive layer 131, and a hard mask 133 are sequentially formed on the semiconductor substrate, including the cell area and the peripheral area.

Here, the second conductive layer 127, the barrier metal layer 129, and the third conductive layer 131 serve as a lower electrode in the cell area. The first conductive layer, 125, the second conductive layer 127, the barrier metal layer 129, and the third conductive layer 131 serve as a gate electrode of the transistor in the peripheral area.

Each of the first conductive layer 125, the second conductive layer 127, and the third conductive layer 131 may be formed of W, Cu, TIN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, or a semiconductor material, such as doped-Si or doped-SiGe, or the like.

Figure 15:
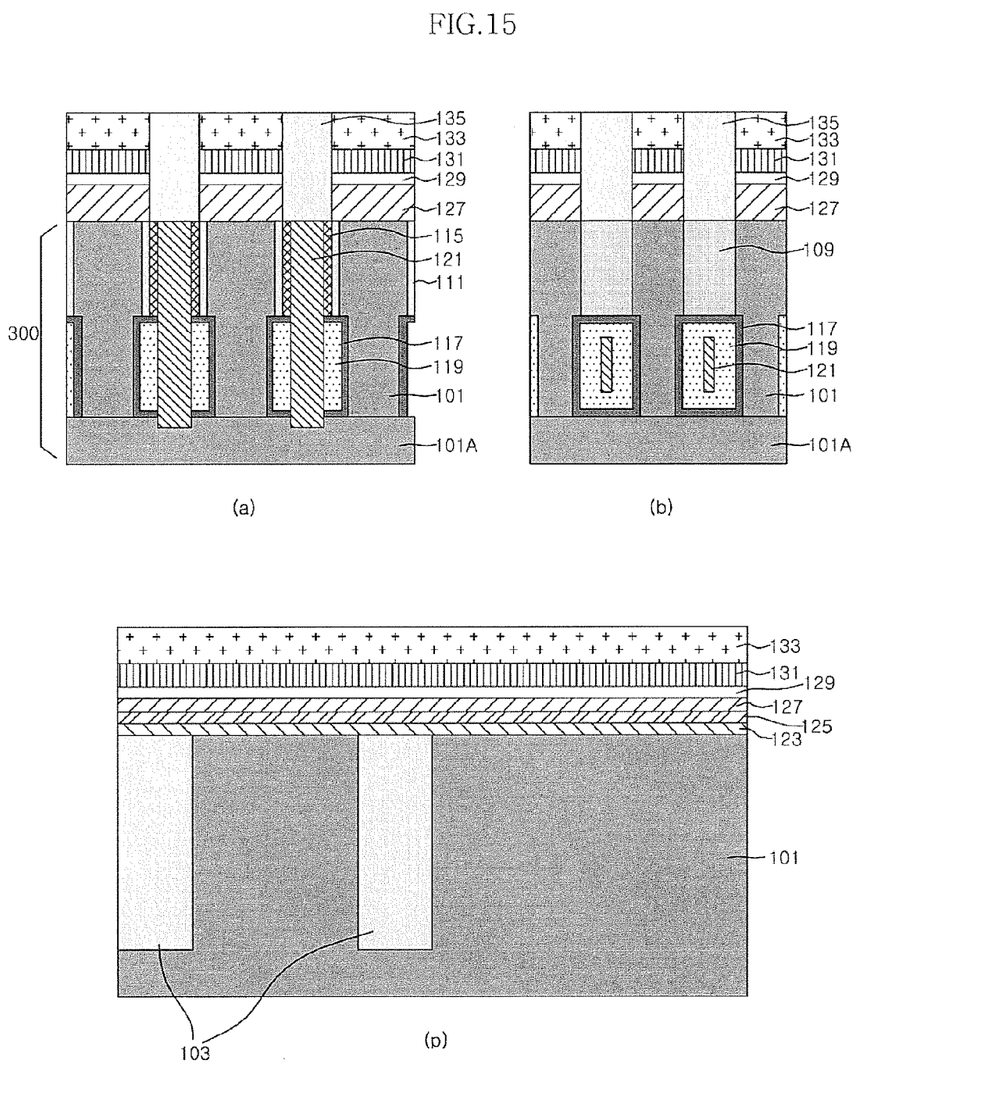

As illustrated in FIG. 15, in the cell area, the hard mask 133, the third conductive layer 131, the barrier metal layer 129, and the second conductive layer 127 are patterned to expose an upper surface of the fourth insulating layer 121 formed in the cell area. Thus, a lower electrode stack is formed. A fifth insulating layer 135 is formed between lower electrode stacks.

Figure 16:
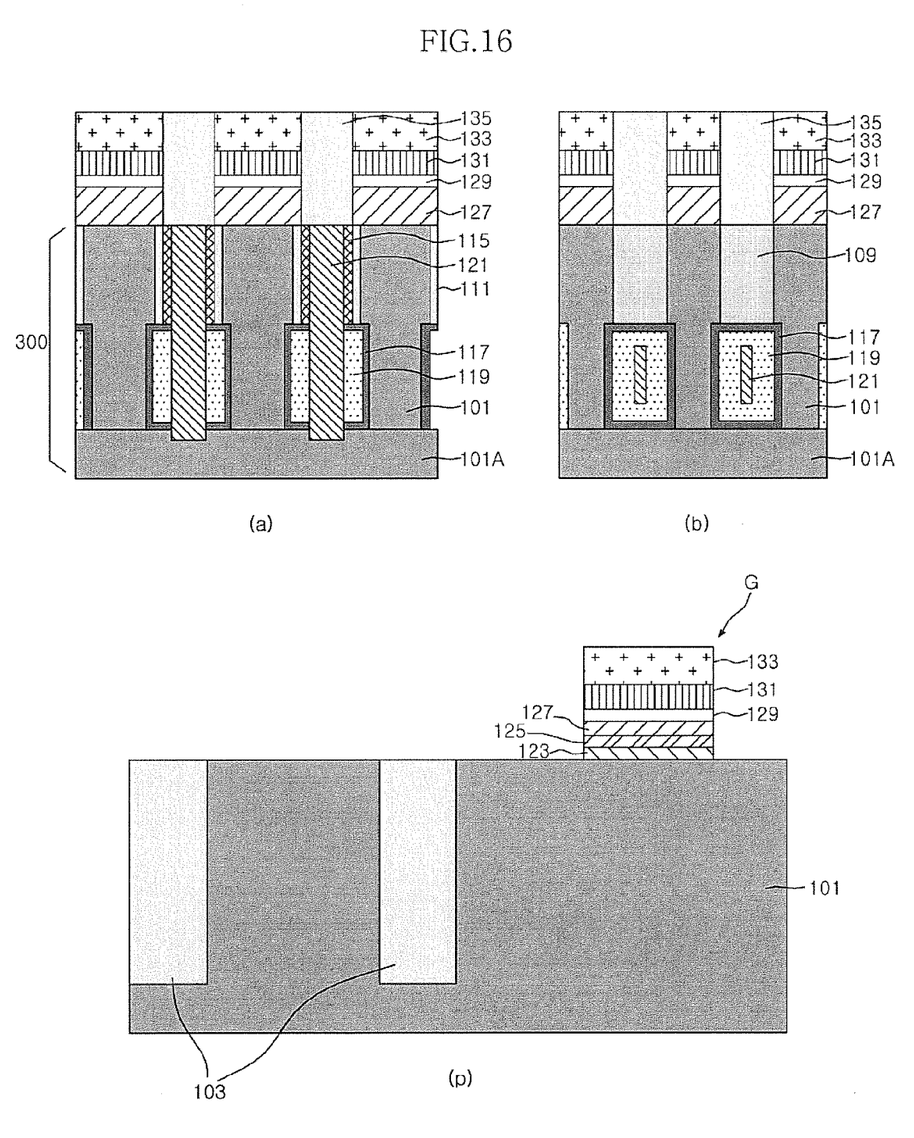

As illustrated in FIG. 16, the hard mask 133, the third conductive layer 131, the barrier metal layer 129, the second conductive layer 127, the first conductive layer 125, and the third gate oxide layer 123 in the peripheral area are patterned to form a gate stack G.

Figure 17:
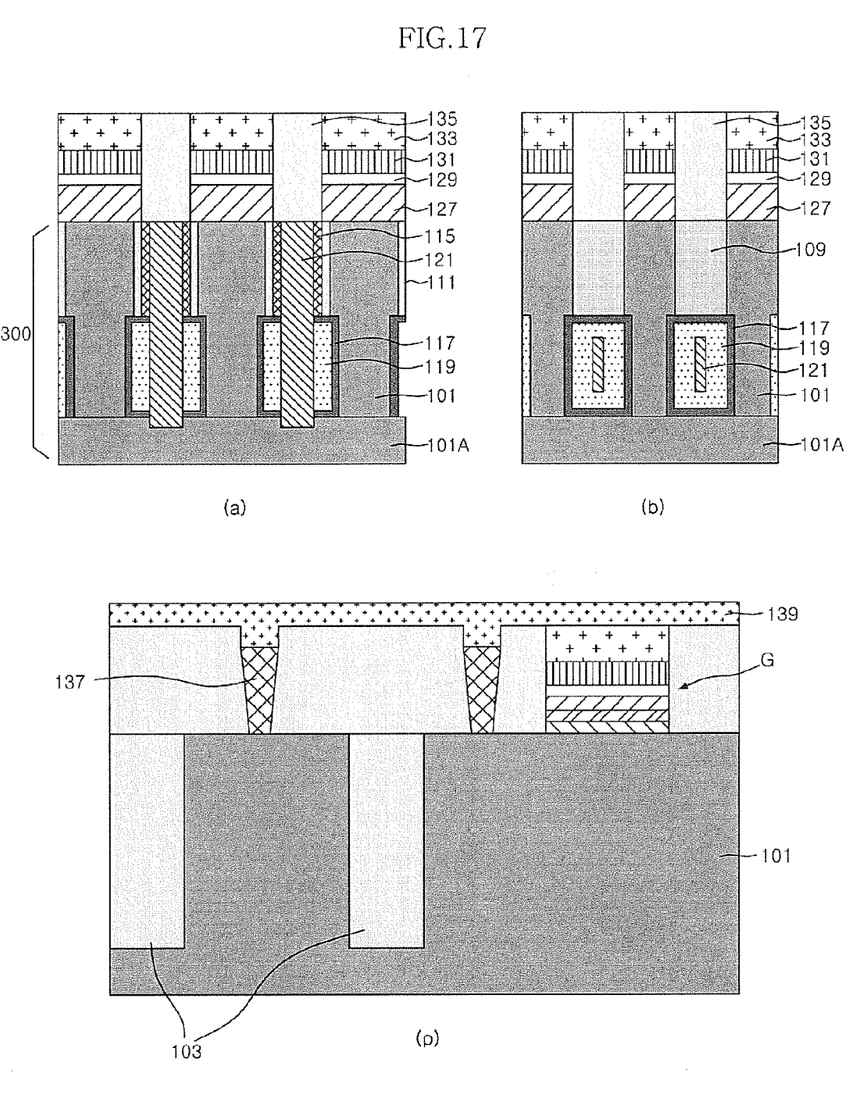

As illustrated in FIG. 17, a contact 137, which contacts the semiconductor substrate 101 in the peripheral area, is formed and a sixth insulating layer 139 is formed on the semiconductor substrate of the entire peripheral area, including the contact 137. The sixth insulating layer 139 serves to protect a pattern formed in the peripheral area when the hard mask 133 in the cell area is removed in a subsequent process.

Figure 18:
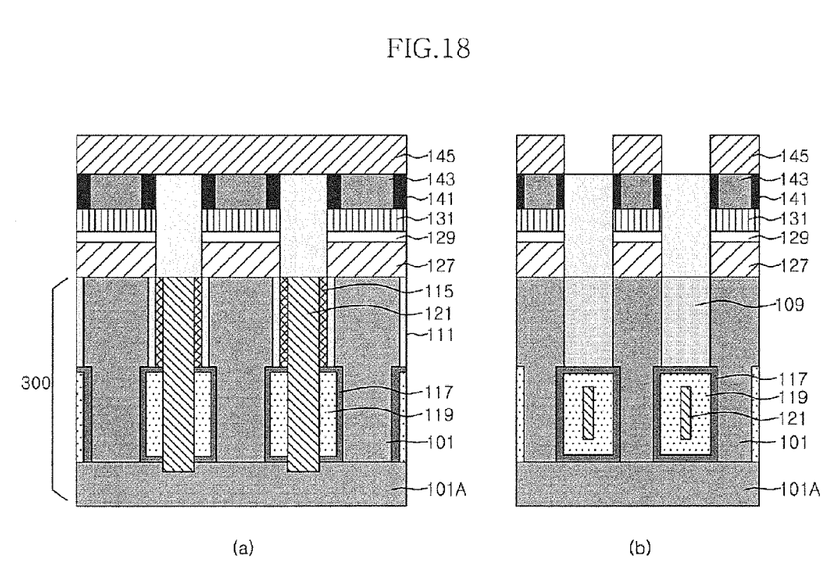

FIG. 18 illustrates only the cell area and illustrates a bottom structure 300, in which a vertical transistor is formed. The lower electrode stack 127, 129, and 131 is formed on the bottom structure 300. A data storage material 143 is electrically connected to the lower electrode stack 127, 129, and 131, and an wiring layer 145 is formed.

Specifically, after the process illustrated in FIG. 17 is performed, the hard mask 133 in the cell area is removed and a space is formed between adjacent fifth insulating layers 135. A spacer insulating layer 141 is formed on a sidewall of the fifth insulating layer 135, a data storage material 143 is buried within the space, and the wiring layer 145 is formed on the semiconductor substrate, including the data storage material 143, so that the structure illustrated in FIG. 18 may be formed.

The data storage material 143 may include a material for a PCRAM, a material for a ReRAM, a material for a spin-transfer torque magnetoresistive RAM (STTMRAM), and a material for a polymer RAM (PoRAM). For example, if the vertical memory device is a PCRAM, then the data storage material may be tellurium (Te), selenium (Se), germanium (Ge), antimony (Sb), bismuth (Bi), lead (Pb), tin (Sn), arsenic (As), sulfur (S), silicon (Si), phosphorus (P), oxygen (O), nitrogen (N), a compound thereof, or an alloy thereof.

The method of forming the data storage material illustrated in FIG. 18 is illustrative and any one of applicable various methods may be used.

The example in which the common source region 101A is formed through the ion implantation process is merely illustrative. Alternatively, an wiring layer of a line pattern may be formed as the common source region 101A.

The example of forming the vertical type semiconductor device in a single layer has been illustrated. However, an exemplary vertical type semiconductor device may be formed in a stacked structure, such as a multilevel stack structure. Alternatively, an exemplary semiconductor device may have the cell structures illustrated in FIG. 18, in which the cell structures are sequentially, symmetrically stacked in a mirror type on the basis of the wiring layer, or in which the cell structures are symmetrically stacked in a mirror type on the basis of the common source region.

The above implementation is illustrative and not limiting. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a vertical type semiconductor device, the method comprising:
   providing a semiconductor substrate having a cell area and a peripheral area;

patterning the semiconductor substrate of the cell area to form a pillar structure;

forming, in the pillar structure, a recess from a bottom of the pillar structure to a predetermined height; and forming an electrode material to surround the recess, wherein the forming the pillar structure includes:

patterning the semiconductor substrate of the cell area to form first pattern structures;

forming, on the semiconductor substrate between the first pattern structures, a first insulating layer to the predetermined height;

forming, between the first pattern structures, a second insulating layer on the first insulating layer;

patterning the semiconductor substrate of the cell area to form a second pattern structure;

forming a first gate insulating layer on an exposed surface of the semiconductor substrate;

forming, between the second pattern structures, a third insulating layer to the predetermined height;

forming a protection layer on a sidewall of the second pattern structure and on the third insulating layer; and     removing the first insulating layer and the third insulating layer.

2. The method of claim 1, wherein the first insulating layer includes a material having an etch selectivity that is different than an etch selectivity of the second insulating layer.

3. The method of claim 1, wherein the first insulating layer includes a material having a same etch selectivity as an etch selectivity of the second insulating layer.

4. The method of claim 1, further comprising:
forming a common source region, a channel region, and a drain region in the semiconductor substrate before the forming the pillar structure.

5. The method of claim 1, further comprising:
forming a common source region, a channel region, and a drain region in semiconductor substrate after the forming the electrode material.

6. The method of claim 5, wherein the channel region is formed from the bottom of the pillar structure to the predetermined height.

7. The method of claim 1, further comprising:
simultaneously forming a lower electrode on the pillar structure of the cell area and forming a gate electrode on the semiconductor substrate of the peripheral area, after the forming the electrode material.

8. The method of claim 7, wherein the forming the lower electrode and the gate electrode comprises:

sequentially forming a gate oxide layer and a first conductive layer on the cell area and the peripheral area;

removing the gate oxide layer and the first conductive layer in the cell area;

forming a second conductive layer on the cell area and the peripheral area;

patterning, in the cell area, the second conductive layer to form the lower electrode electrically connected to each of the pillar structures; and     patterning, in the peripheral area, the second conductive layer, the first conductive layer, and the gate oxide layer to form the gate electrode.

9. The method of claim 8, further comprising:
forming a data storage material on the lower electrode.

10. The method of claim 1, further comprising:
forming a memory cell on each of the pillar structures.

11. The method of claim 10, wherein the forming a memory cell includes:

simultaneously forming a lower electrode on each of the pillar structures of the cell area to be electrically connected to each of the pillar structures and a gate electrode on the semiconductor substrate of the peripheral area; and     forming a data storage material on the lower electrode.

* * * * *